(12) United States Patent
Muraki et al.

(10) Patent No.: US 6,903,352 B2
(45) Date of Patent: Jun. 7, 2005

(54) CHARGED-PARTICLE BEAM EXPOSURE APPARATUS, CHARGED-PARTICLE BEAM EXPOSURE METHOD, CONTROL DATA DETERMINATION METHOD, AND DEVICE MANUFACTURING METHOD USING THIS METHOD

(75) Inventors: Masato Muraki, Tokyo (JP); Yoshikiyo Yui, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 230 days.

(21) Appl. No.: 09/733,980

(22) Filed: Dec. 12, 2000

(65) Prior Publication Data
US 2002/0008207 A1 Jan. 24, 2002

(30) Foreign Application Priority Data
Dec. 13, 1999 (JP) ............................................. 11-353483

(51) Int. Cl.[7] .................................................. G03F 9/00
(52) U.S. Cl. .............................. 250/492.22; 250/492.3; 250/492.2; 250/398; 430/296
(58) Field of Search ......................... 250/492.22, 492.2, 250/492.3, 398; 430/296

(56) References Cited

U.S. PATENT DOCUMENTS

| 5,834,783 | A | | 11/1998 | Muraki et al. ............... 250/398 |
| 5,847,959 | A | * | 12/1998 | Veneklasen et al. ......... 700/121 |
| 5,863,682 | A | * | 1/1999 | Abe et al. ..................... 430/30 |
| 5,973,332 | A | | 10/1999 | Muraki et al. ............ 250/492.2 |
| 6,118,129 | A | * | 9/2000 | Oae et al. ............... 250/492.22 |
| 6,501,083 | B1 | * | 12/2002 | Kamijo ................... 250/492.22 |
| 6,610,989 | B1 | * | 8/2003 | Takahashi ................ 250/492.3 |

OTHER PUBLICATIONS

M. Parikhh, J., *Corrections To Proximity Effects in Electron Beam Lithography*, App. Phys. 50(g), pp. 4378–4382 (1979).

J.M. Parkovich, *Proximity Effect Correction Calculations by the Integral Equation Approximate Solution Method*, Journal of Vacuum Science & Technology B4(1), pp. 159–162 (1986).

* cited by examiner

*Primary Examiner*—Nikita Wells
(74) *Attorney, Agent, or Firm*—Fitzpatrick, Cella, Harper & Scinto

(57) ABSTRACT

A charged-particle beam exposure apparatus for exposing a member to be exposed to a charged particle beam with a pattern includes memories (902–905) for storing a plurality of control data for controlling reference dose data of the charged particle beam in accordance with the incident position of the charged particle beam on the member to be exposed, a selector (907) for selecting any one of the plurality of control data stored in the memories, and an exposure unit for controlling the reference dose data of the charged particle beam for each irradiation position on the basis of the control data selected by the selector, thereby exposing the member to be exposed with the pattern. The charged-particle beam exposure apparatus rapidly performs proper proximity effect correction to expose the member to be exposed with the pattern.

26 Claims, 15 Drawing Sheets

FIG. 12

| DRAWING POSITION | CORRECTION EXPOSURE INFORMATION 1 | ... | CORRECTION EXPOSURE INFORMATION m |
|---|---|---|---|
| (X1,Y1) | B(1, 1) | ... | B(1, m) |
| ... | ... | ... | ... |
| ... | ... | ... | ... |
| ... | ... | ... | ... |
| (Xn,Yn) | B(n, 1) | ... | B(n, m) |

1201 / 1202 / 1203

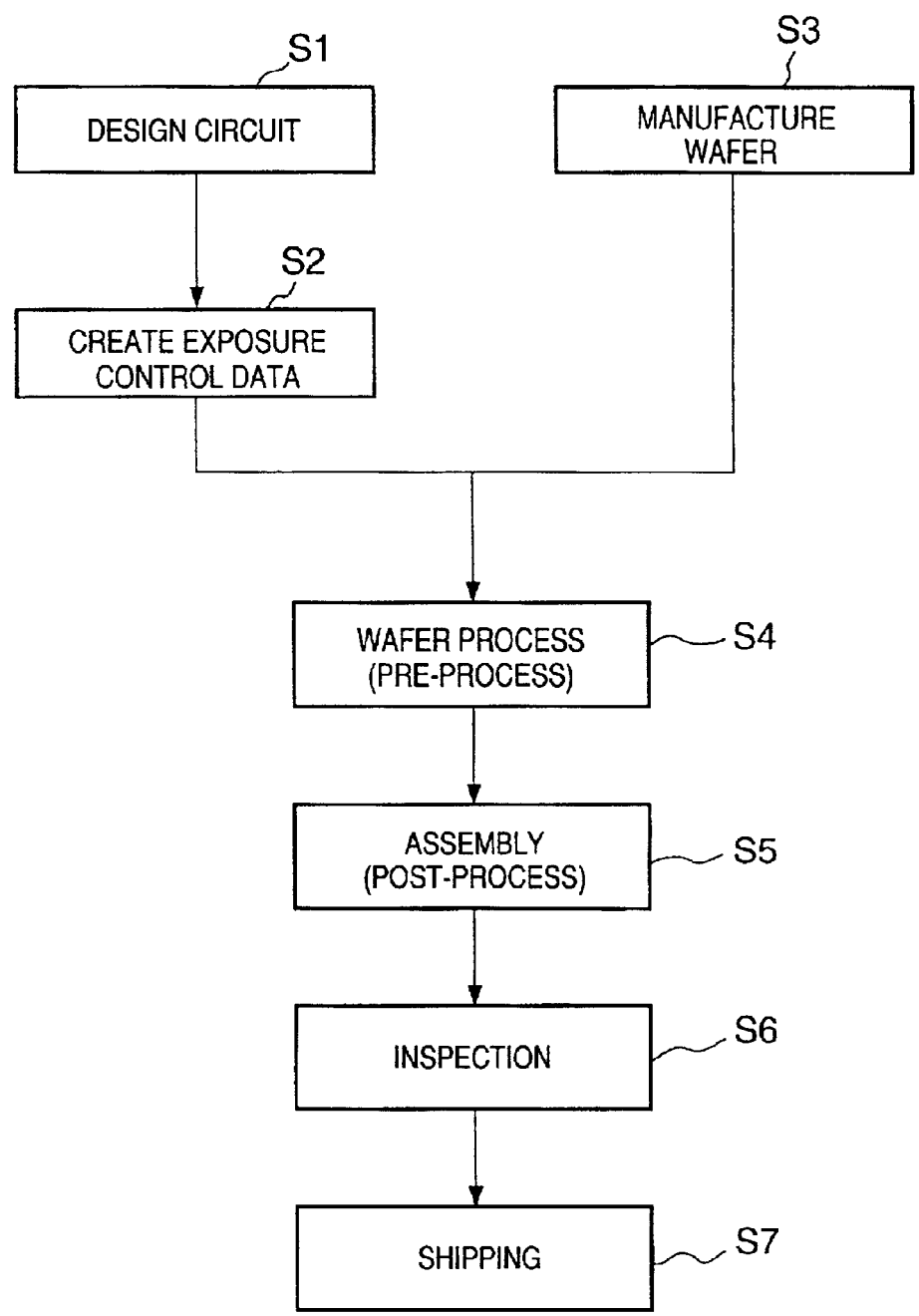

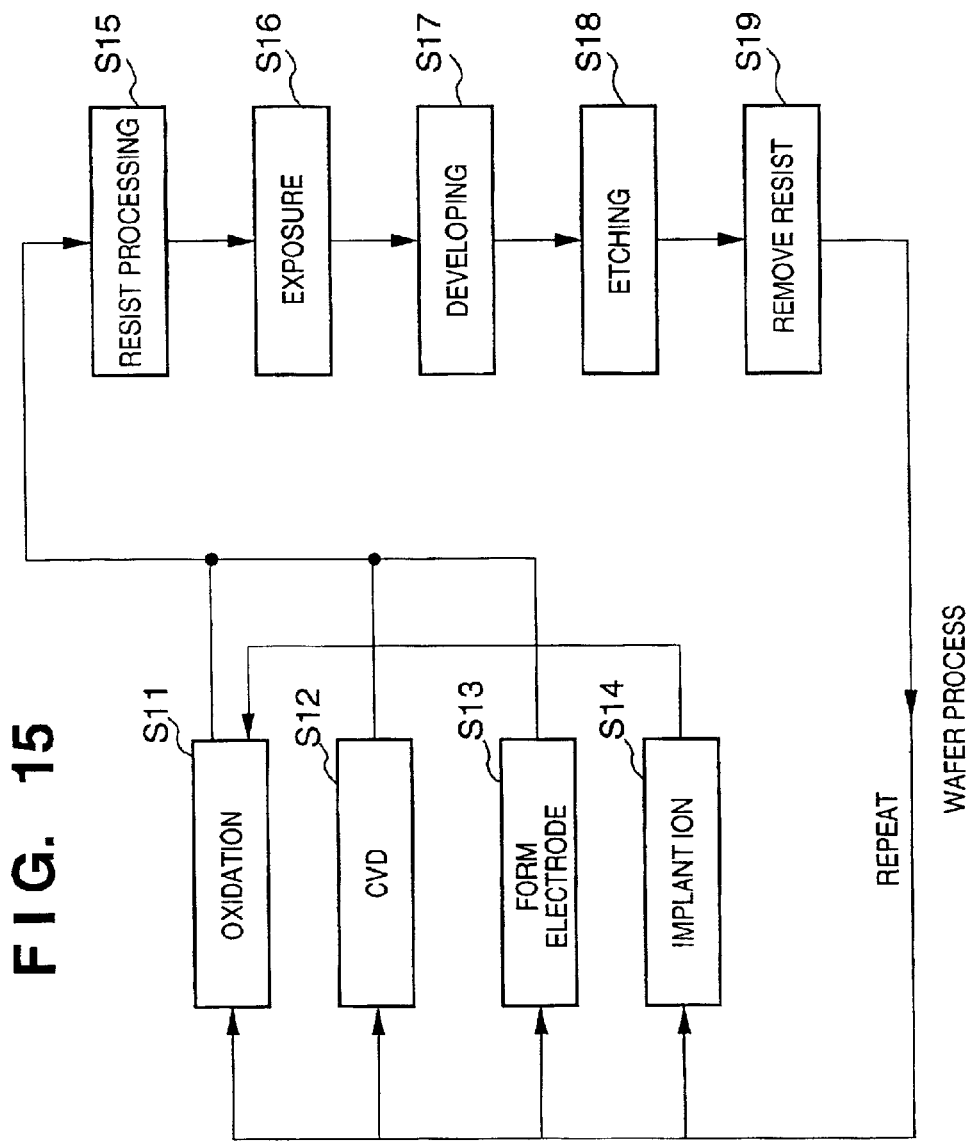

CHARGED-PARTICLE BEAM EXPOSURE APPARATUS, CHARGED-PARTICLE BEAM EXPOSURE METHOD, CONTROL DATA DETERMINATION METHOD, AND DEVICE MANUFACTURING METHOD USING THIS METHOD

FIELD OF THE INVENTION

The present invention relates to a charged-particle beam exposure apparatus, an exposure method therefor, and a device manufacturing method using this method or the like and, more particularly, to a charged-particle beam exposure apparatus capable of rapidly, properly performing proximity effect correction in exposing a substrate to a charged particle beam with a pattern, an exposure method therefor, and a device manufacturing method using this method or the like.

BACKGROUND OF THE INVENTION

Recently, an electron beam drawing apparatus is used to draw a fine pattern on a sample such as a semiconductor wafer or mask substrate. This apparatus suffers the influence of a so-called proximity effect in which a pattern becomes thick or thin owing to backward scattering electrons.

One of effective methods of correcting the proximity effect is a dosage correction method. As the method of determining the optimal dosage, there are adopted method (a) using a matrix (M. Parikhh, J. App. Phys. 19, p. 4371, p. 4378, p. 4383 (1979)), and method (b) using a simple approximate solution formula (e.g., J. M. Parkovich, Journal of Vacuum Science & Technology B4, p. 159 (1986)).

According to method (a), the relationship between the dosage and the sensitivity at each position is expressed by a matrix, and the inverse matrix of this matrix is calculated to obtain an optimal dosage at each position. The advantage of this method is that an accurate optimal dosage can be obtained by sufficiently decreasing the size of a figure for which a dosage is set. The disadvantage is a long calculation time. This method requires several hundred to several thousand hours to correct the proximity effect for all direct writing LSI chips.

According to method (b), an approximate value D' of an optimal dosage is calculated by, e.g., the following formulae (1) and (2):

$$D'=C/(\frac{1}{2}+\eta U) \quad (1)$$

$$U=(1/\pi)\int \exp\{-(x-x')^2-(y-y')^2\}dx'dy' \quad (2)$$

where C is a constant, and $\eta$ is the ratio of a resist sensitivity by forward scattering of an electron beam to that by backward scattering. Letting (x,y) be a dosage evaluation point, the integral range of the parameter U is a rectangle present within a circle having a radius about two or three times the backward scattering radius using (x,y) as the center, or a rectangle overlapping even part of the circle. However, even the use of the approximate solution formulae requires several hours to correct the proximity effect for all direct writing LSI chips.

In this manner, the conventional methods require at least several hours for a proximity effect correction calculation time. On the other hand, $\eta$, the backward scattering radius, and the like as parameters of proximity effect correction calculation change depending on a resist applied to a target wafer, the film material of a wafer surface, or the like, so that parameters ($\eta$, backward scattering radius, and the like) for achieving an optimal proximity effect must be obtained. For this purpose, the step of changing parameters to recalculate proximity effect correction, and the step of actually exposing and evacuating a wafer using the recalculated proximity effect correction are repeated. This occupies an electron beam drawing apparatus for several ten hours in order to only determine parameters, which decreases the availability of the electron beam drawing apparatus.

SUMMARY OF THE INVENTION

The present invention has been proposed to solve the conventional problems, and has as its object to provide a charged-particle beam exposure apparatus which can select a proper one of a plurality of pieces of correction exposure information in accordance with the conditions of a surface to be exposed, thereby rapidly performing proper proximity effect correction, and an exposure method therefor.

According to the first aspect of the present invention, a charged-particle beam exposure apparatus for exposing a member to be exposed to a charged particle beam with a pattern comprises storage means for storing a plurality of data for controlling a dosage of the charged particle beam in accordance with an irradiation position of the charged particle beam on the member to be exposed, selection means for selecting any one of the plurality of data stored in the storage means, and exposure means for controlling the dosage of the charged particle beam for each irradiation position on the basis of the data selected by the selection means, thereby exposing the member to be exposed with the pattern.

In the charged-particle beam exposure apparatus according to the first aspect of the present invention, for example, the control data preferably includes correction data for correcting influence of a proximity effect on reference dose data.

According to the second aspect of the present invention, a charged-particle beam exposure apparatus for exposing a member to be exposed to a charged particle beam with a pattern comprises first storage means for storing reference dose data of the charged particle beam in accordance with an irradiation position of the charged particle beam on the member to be exposed, second storage means for storing a plurality of control data for performing proximity effect correction for respective irradiation positions with respect to the reference dose data, selection means for selecting one of the plurality of control data stored in the second storage means, and exposure means for performing proximity effect correction for the reference dose data on the basis of the control data selected by the selection means, thereby exposing the member to be exposed with the pattern.

In the charged-particle beam exposure apparatus according to the second aspect of the present invention, for example, the reference dose data preferably includes data for defining bitmap data determined depending on a pattern to be exposed, or data for defining bitmap data and an irradiation time ratio.

In the charged-particle beam exposure apparatus according to the second aspect of the present invention, for example, the control data preferably includes data which does not depend on a pattern to be exposed but depends on a condition of the member to be exposed.

In the charged-particle beam exposure apparatus according to the second aspect of the present invention, for example, the condition is preferably determined using as a parameter at least one of an underlayer condition of the member to be exposed, a resist material, and a backward scattering radius.

According to the third aspect of the present invention, a control data determination method comprises the step of generating reference dose data of a charged particle beam for exposing a member to be exposed with a reference pattern, the generation step of generating a plurality of control data for respective irradiation positions in accordance with conditions of the member to be exposed, the storage step of storing in a memory the plurality of generated control data for the respective irradiation positions, the selection step of selecting any one of the plurality of control data for the respective irradiation positions that are stored in the memory, the exposure step of performing proximity effect correction for the reference dose data on the basis of the selected control data, thereby exposing the member to be exposed with a pattern, the determination step of evaluating the exposed pattern to determine whether the one selected control data is optimal data for controlling the reference dose data, and the control data determination step of determining optimal control data for controlling the reference dose data in accordance with a determination result, wherein the selection step comprises selecting control data other than the one selected control data until optimal control data is determined based on the determination result, and the determination step comprises evaluating the exposed pattern based on the selected control data.

In the control data determination method according to the third aspect of the present invention, for example, whether the one selected control data is optimal data for controlling the reference dose data is preferably determined by comparing the exposed pattern with the reference pattern by a visual check.

In the control data determination method according to the third aspect of the present invention, for example, whether the one selected control data is optimal data for controlling the reference dose data is preferably determined by evaluation means for comparing the exposed pattern with the reference pattern.

In the control data determination method according to the third aspect of the present invention, for example, the reference dose data preferably includes data determined depending on a pattern to be exposed.

In the control data determination method according to the third aspect of the present invention, for example, the control data preferably includes data which does not depend on a pattern to be exposed but depends on a condition of the member to be exposed.

In the control data determination method according to the third aspect of the present invention, for example, the condition is preferably determined using as a parameter at least one of an underlayer condition of the member to be exposed, a resist material, and a backward scattering radius.

According to the fourth aspect of the present invention, a charged-particle beam exposure method of exposing a member to be exposed to a charged particle beam with a pattern comprises the step of generating a plurality of data for controlling a dosage of the charged particle beam in accordance with an irradiation position of the charged particle beam on the member to be exposed, and storing the data in a memory, the selection step of selecting any one of the plurality of data stored in the memory, and the exposure step of controlling the dosage of the charged particle beam for each irradiation position on the basis of the data selected in the selection step, thereby exposing the member to be exposed with the pattern.

In the charged-particle beam exposure method according to the fourth aspect of the present invention, for example, the control data preferably includes correction data for correcting influence of a proximity effect on reference dose data.

According to the fifth aspect of the present invention, a charged-particle beam exposure method of exposing a member to be exposed to a charged particle beam with a pattern comprises the step of generating reference dose data of the charged particle beam in accordance with an irradiation position of the charged particle beam on the member to be exposed, and storing the reference dose data in a first memory, the step of generating a plurality of control data for performing proximity effect correction for respective irradiation positions with respect to the reference dose data, and storing the control data in a second memory, the selection step of selecting one of the plurality of control data stored in the second memory, and the exposure step of performing proximity effect correction for the reference dose data on the basis of the control data selected in the selection step, thereby exposing the member to be exposed with the pattern.

In the charged-particle beam exposure method according to the fifth aspect of the present invention, for example, the reference dose data preferably includes data determined depending on a pattern to be exposed.

In the charged-particle beam exposure method according to the fifth aspect of the present invention, for example, the control data preferably includes data which does not depend on a pattern to be exposed but depends on a condition of the member to be exposed.

In the charged-particle beam exposure method according to the fifth aspect of the present invention, for example, the condition is preferably determined using as a parameter at least one of an underlayer condition of the member to be exposed, a resist material, and a backward scattering radius.

According to the sixth aspect of the present invention, a device manufacturing method includes the step of performing proximity effect correction for each irradiation position of a charged particle beam by the charged-particle beam exposure method according to the fourth aspect, thereby exposing a substrate with a pattern.

According to the seventh aspect of the present invention, a device manufacturing method uses for part of the manufacturing process a charged-particle beam exposure apparatus for performing proximity effect correction for a charged particle beam to expose a member to be exposed with a pattern, wherein the charged-particle beam exposure apparatus executes the step of generating a plurality of control data for controlling reference dose data of the charged particle beam in accordance with an irradiation position of the charged particle beam on the member to be exposed, and storing the control data in a memory, the selection step of selecting any one of the plurality of control data stored in the memory, and the exposure step of controlling the reference dose data of the charged particle beam for each irradiation position on the basis of the control data selected in the selection step, thereby exposing the member to be exposed with the pattern.

According to the eighth aspect of the present invention, a device manufacturing method uses for part of the manufacturing process a charged-particle beam exposure apparatus for performing proximity effect correction for a charged particle beam to expose a member to be exposed with a pattern, wherein the charged-particle beam exposure apparatus executes the step of generating reference dose data of the charged particle beam in accordance with an irradiation position of the charged particle beam on the member to be exposed, and storing the reference dose data in a first memory, the step of generating a plurality of control data for performing proximity effect correction for respective irradiation positions with respect to the reference dose data, and storing the control data in a second memory, the selection step of selecting one of the plurality of control data stored in the second memory, and the exposure step of performing proximity effect correction for the reference dose data on the basis of the control data selected in the selection step, thereby exposing the member to be exposed with the pattern.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 12 is a table for explaining the relationship between the drawing position and correction exposure information;

FIG. 14 is a flow chart showing the manufacturing flow of a microdevice (semiconductor chip such as an IC or LSI, liquid crystal panel, CCD, thin-film magnetic head, micromachine, or the like); and FIG. 15 is a flow chart showing the detailed flow of the wafer process shown in FIG. 14.

DETAILED DESCRIPTION OF THE PREFERRED EMBODIMENTS

Preferred embodiments of the present invention will now be described in detail in accordance with the accompanying drawings.

The embodiments will explain an electron beam exposure apparatus as an example of the charged-particle beam exposure apparatus. However, the present invention is not limited to an electron beam exposure apparatus, but can also be applied to, e.g., an ion beam exposure apparatus.

Figure 1:
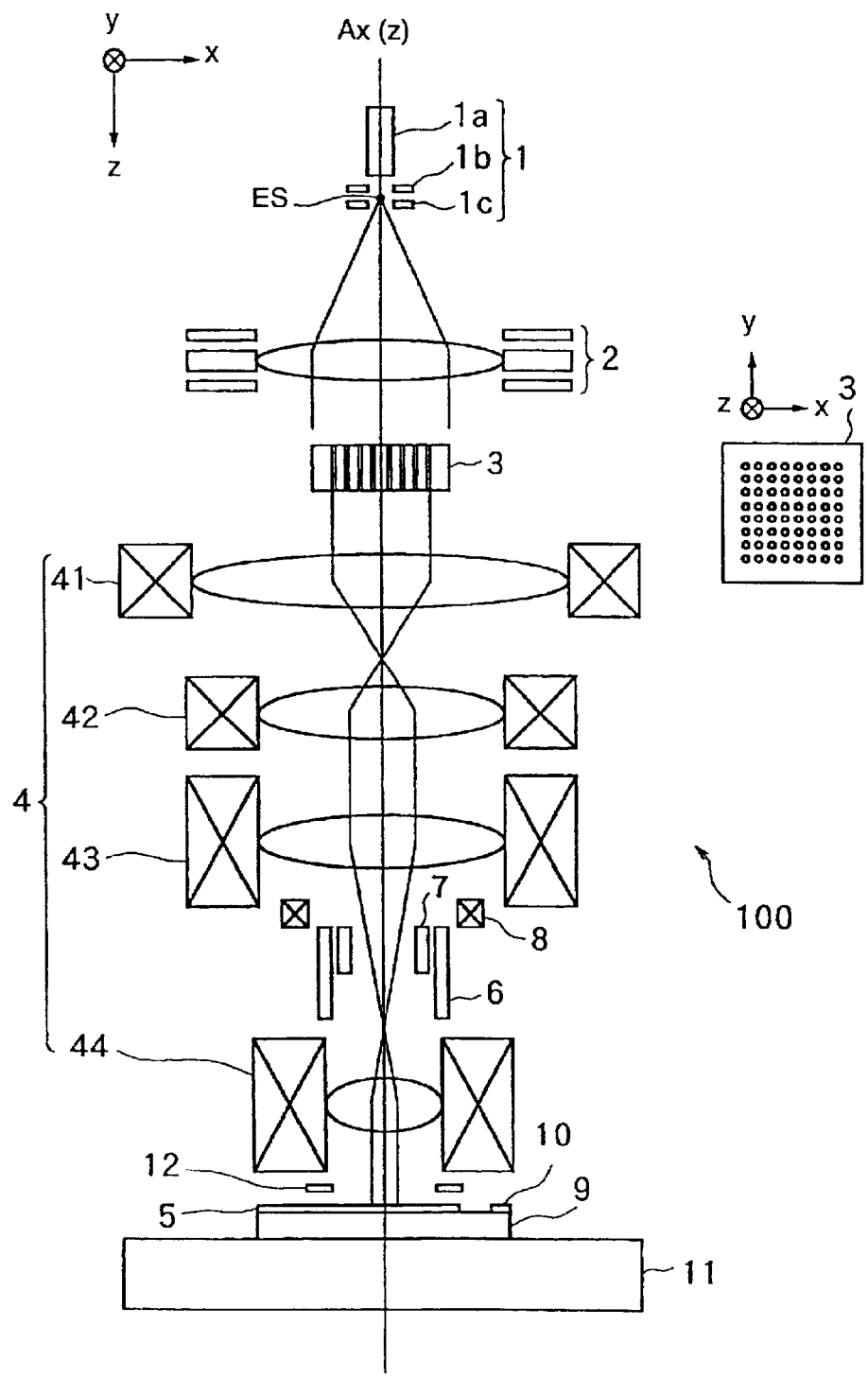
FIG. 1 is a schematic view showing an electron beam exposure apparatus according to a preferred embodiment of the present invention.

FIG. 1 is a schematic view showing an electron beam exposure apparatus according to a preferred embodiment of the present invention. Reference numeral 1 denotes an electron gun including a cathode 1a, grid 1b, and anode 1c. Electrons emitted by the cathode 1a form a crossover image as an electron source ES between the grid 1b and the anode 1c.

Electrons emitted by the electron source ES irradiate a correction electron optical system 3 via a condenser lens 2. The condenser lens 2 is comprised of, e.g., three aperture electrodes.

Figure 2A:
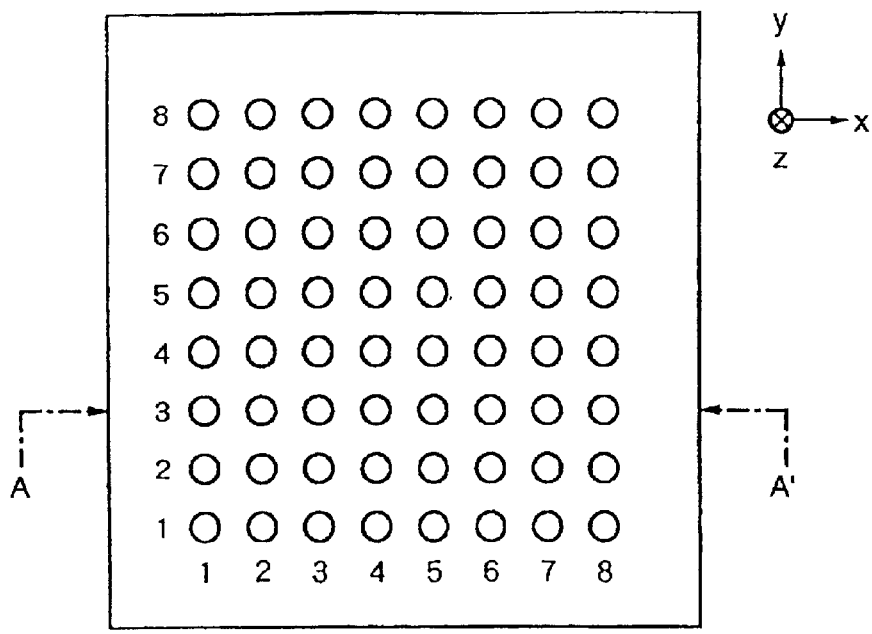
FIGS. 2A and 2B are views showing the detailed arrangement of a correction electron optical system.
Figure 2B:
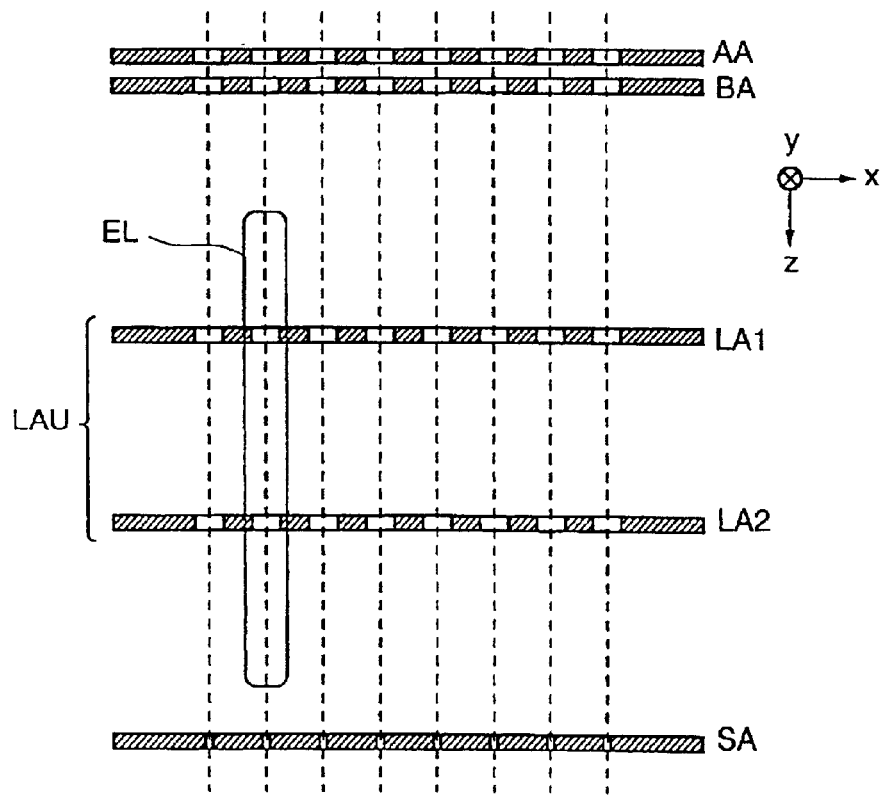

As shown in FIG. 2B, the correction electron optical system 3 is constituted by an aperture array AA, blanker array BA, correction electron optical system unit LAU, and stopper array SA sequentially arranged along an optical axis AX from the electron gun 1 side. Details of the correction electron optical system 3 will be described later.

The correction electron optical system 3 forms a plurality of intermediate images of the electron source ES, and each intermediate image is reduced and projected on a substrate 5 such as a wafer via a reduction electron optical system 4. Accordingly, a plurality of electron source images having the same shape are formed on the substrate 5. The correction electron optical system 3 forms these intermediate images so as to correct aberration generated upon reducing and projecting the intermediate images on the substrate 5 via the reduction electron optical system 4.

The reduction electron optical system 4 is constituted by a symmetrical magnetic doublet made up of a first projection lens 41 and second projection lens 42, and a symmetrical magnetic doublet made up of a first projection lens 43 and second projection lens 44. Letting f1 be the focal length of the first projection lens 41 (43), and f2 be the focal length of the second projection lens 42 (44), the distance between the two lenses is f1+f2.

The object point on the optical axis AX is at the focal position of the first projection lens 41 (43), and the image point is at the focal point of the second projection lens 42 (44). This image is reduced to −f2/f1. Since the magnetic fields of the two lenses are determined to act in opposite directions in an exposure apparatus 100, Seidel aberrations and chromatic aberrations concerning rotation and magnification are theoretically canceled except for five aberrations, i.e., spherical aberration, isotropic astigmatism, isotropic coma, curvature of field, and on-axis chromatic aberration.

Reference numeral 6 denotes a deflector for deflecting a plurality of electron beams from the correction electron optical system 3 and displacing a plurality of electron source images on the substrate 5 by almost the same displacement amount in the X and Y directions. Although not shown, the deflector 6 is comprised of a main deflector used when the scan width is large, and a sub-deflector used when the scan width is small. The main deflector is an electromagnetic deflector, whereas the sub-deflector is an electrostatic deflector.

Reference numeral 7 denotes a dynamic focus coil for correcting a shift in the focal position of an electron source image caused by deflection aberration generated upon operating the deflector 6; and 8, a dynamic stigmatic coil for correcting astigmatism among deflection aberrations generated by deflection.

Reference numeral 9 denotes a θ-Z stage which supports the substrate 5 and is movable in the optical axis AX (Z-axis) direction and the rotational direction around the Z-axis. A stage reference plate 10 is fixed to the θ-Z stage 9.

Reference numeral 11 denotes an X-Y stage which supports the θ-Z stage and is movable in the X and Y directions perpendicular to the optical axis AX (Z-axis).

Reference numeral 12 denotes a reflected-electron detector for detecting reflected electrons generated upon irradiating a mark on the stage reference plate 10 with an electron beam.

The arrangement of the correction electron optical system 3 will be explained with reference to FIGS. 2A and 2B. As described above, the correction electron optical system 3 is constituted by the aperture array AA, blanker array BA, correction electron optical system unit LAU, and stopper array SA.

FIG. 2A is a view of the correction electron optical system 3 when viewed from the electron gun 1, and FIG. 2B is a sectional view taken along the line A–A' in FIG. 2A.

As shown in FIG. 2A, the aperture array AA has a plurality of apertures formed in a substrate, and divides an electron beam from the condenser lens 2 into a plurality of electron beams.

Figure 3:
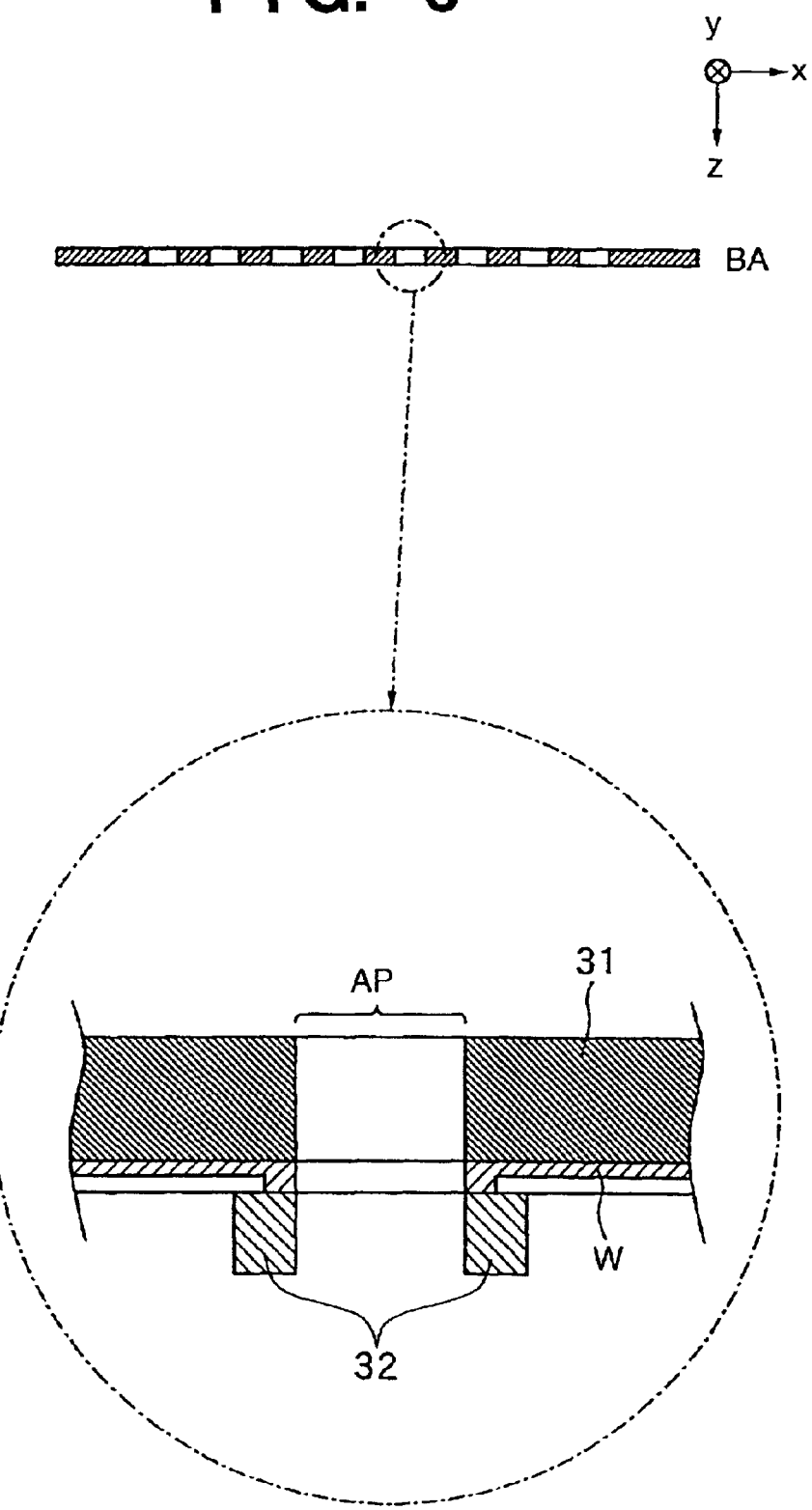
FIG. 3 is a view showing one deflector formed on a blanker array.
Figure 4:
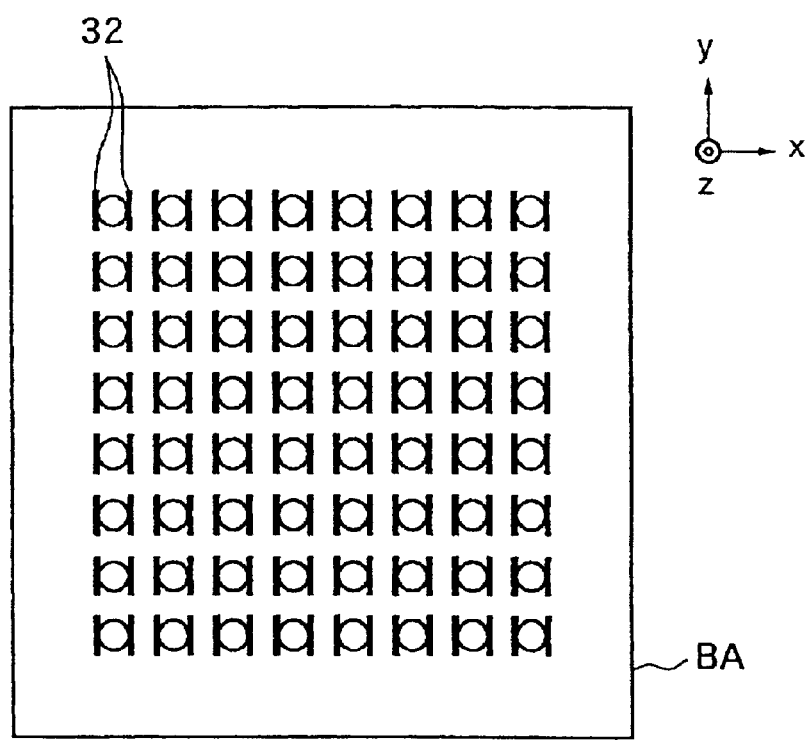
FIG. 4 is a bottom view of the blanker array.

The blanker array BA is obtained by forming on one substrate a plurality of deflectors for individually deflecting electron beams formed by the aperture array AA. FIG. 3 is a view showing one deflector formed in the blanker array BA. The blanker array BA has a substrate 31 having a plurality of apertures AP, blankers 32 each of which is made up of a pair of electrodes via an aperture AP and has a deflection function, and wiring lines W for individually turning on/off the blankers 32. FIG. 4 is a bottom view of the blanker array BA.

The correction electron optical system unit LAU is formed from first and second electron optical system arrays LA1 and LA2 as electron lens arrays each having a plurality of electron lenses two-dimensionally arrayed on the same plane.

Figure 5:
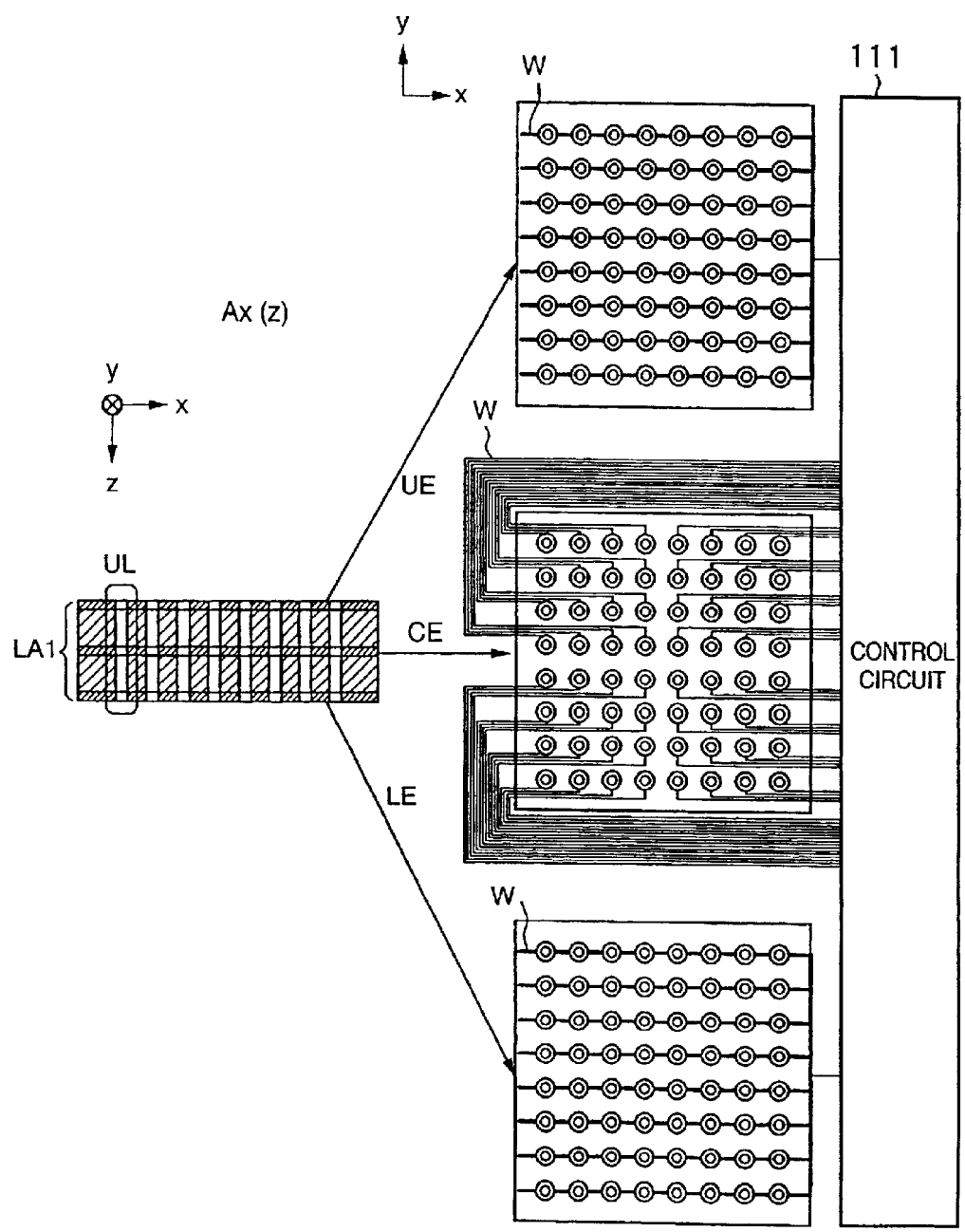
FIG. 5 is a view for explaining first and second electron optical system arrays.

FIG. 5 is a view for explaining the first electron optical system array LA1. The first electron optical system array LA1 has three, upper, intermediate, and lower electrode plates UE, CE, and LE on each of which a plurality of doughnut-like electrodes respectively corresponding to a plurality of apertures are aligned. The three electrode plates are stacked via insulators.

The doughnut-like electrodes of the upper, intermediate, and lower electrode plates at the same X- and Y-coordinates form one electron lens (so-called unipotential lens) UL. The doughnut-like electrode of the upper electrode plate of each electron lens UL is connected to an LAU control circuit 112 via a common wiring line W1, and the doughnut-like electrode of the lower electrode plate of each electron lens UL is connected to the LAU control circuit 112 via a common wiring line W3. An electron beam acceleration potential is applied between the doughnut-like electrodes of the upper and lower electrode plates. The doughnut-like electrode of the intermediate electrode plate of each electron lens receives a proper potential from the LAU control circuit 112 via an individual wiring line W2. This structure can set electron optical power (focal length) of each electron lens to a desired value.

The second electron optical system array LA2 also has the same structure and function as those of the first electron optical system array LA1.

As shown in FIG. 2B, in the correction electron optical system unit LAU, the electron lenses of the first and second electron lens arrays LA1 and LA2 at the same X- and Y-coordinates form one element electron optical system EL.

The aperture array AA is positioned on almost the front focal position side of the respective element electron optical systems EL. Each element electron optical system EL, therefore, forms an intermediate image of the electron source ES at almost the rear focal position by each divided electron beam. To correct the curvature of field generated upon reducing and projecting an intermediate image on the substrate 5 via the reduction electron optical system 4, a potential applied to the doughnut-like electrode of the intermediate electrode plate is adjusted for each element electron optical system EL to adjust the electron optical power of the electron lens, thereby adjusting the intermediate image formation position.

Similar to the aperture array AA, the stopper array SA has a plurality of apertures formed in a substrate. An electron beam deflected by the blanker array BA irradiates a portion outside an aperture of the stopper array SA corresponding to the electron beam, and is shielded by the substrate.

Figure 6:
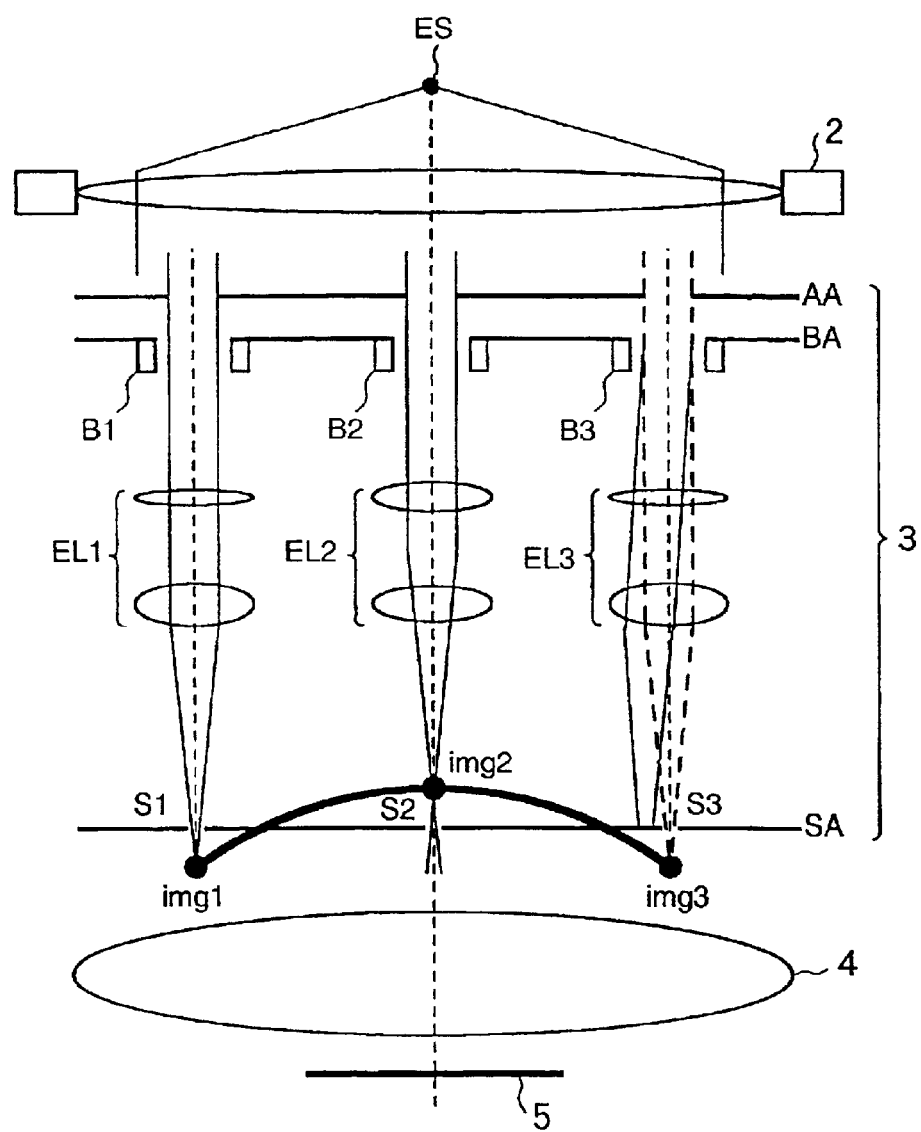
FIG. 6 is a view for explaining the function of the correction electron optical system.

The function of the correction electron optical system 3 will be explained with reference to FIG. 6. Electrons emitted by the electron source ES pass through the condenser lens 2 to form an almost parallel electron beam. Almost the parallel electron beam is divided into a plurality of electron beams by the aperture array AA having a plurality of apertures. The divided electron beams enter element electron optical systems EL1 to EL3 to form intermediate images img1 to img3 of the electron source ES at almost the rear focal positions of the respective element electron optical systems. These intermediate images are projected via the reduction electron optical system 4 on the substrate 5 serving as a surface to be exposed.

To correct the curvature of field (shift between an actual imaging position and an ideal imaging position on the substrate 5 along the optical axis of the reduction electron optical system 4) generated upon projecting a plurality of intermediate images on the surface to be exposed, the optical characteristics of a plurality of element electron optical systems are individually set to change the intermediate image formation position along the optical axis for each element electron optical system.

Whether to irradiate the substrate 5 with each electron beam is individually controlled by blankers B1 to B3 of the blanker array BA and stoppers S1 to S3 of the stopper array SA. In FIG. 6, since the blanker B3 is ON, an electron beam for forming the intermediate image img3 does not pass through the aperture S3 of the stopper array SA, and is shielded by the substrate of the stopper array SA.

Figure 7:
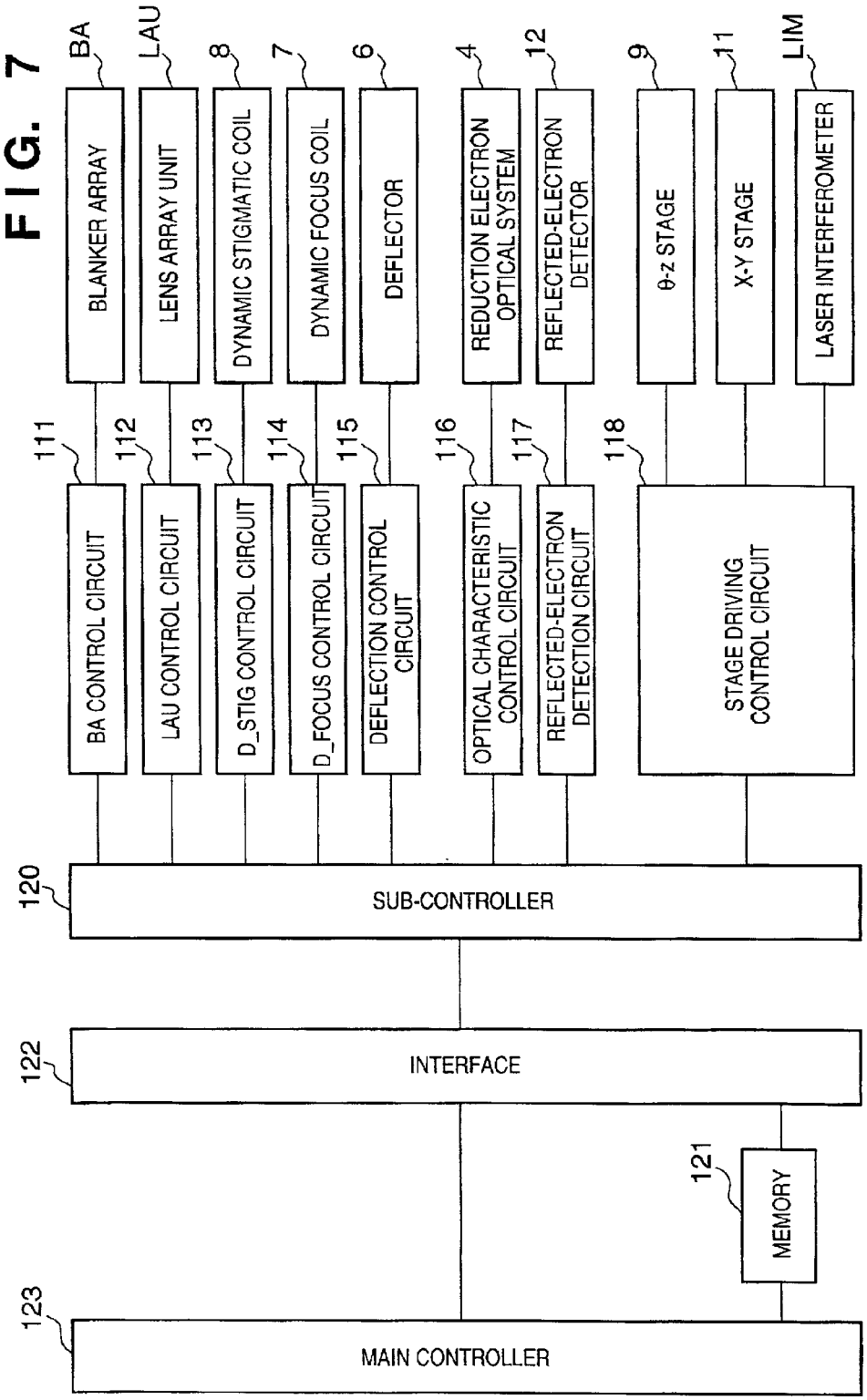
FIG. 7 is a block diagram showing the arrangement of the control system of the electron beam exposure apparatus shown in FIG. 1.

FIG. 7 is a block diagram showing the arrangement of the control system of the electron beam exposure apparatus 100 shown in FIG. 1. A BA control circuit 111 individually controls ON/OFF operation of the respective blankers of the blanker array BA. The detailed arrangement and function of the BA control circuit 111 will be described later. The LAU control circuit 112 controls the focal length of the electron lens EL forming the lens array unit LAU. A D_STIG control circuit 113 controls the dynamic stigmatic coil 8 to correct astigmatism of the reduction electron optical system 4. A D_FOCUS control circuit 114 controls the dynamic focus coil 7 to adjust the focus of the reduction electron optical system 4. A deflection control circuit 115 controls the deflector 6. An optical characteristic control circuit 116 controls the optical characteristics (magnification and distortion) of the reduction electron optical system 4. A reflected-electron detection circuit 117 calculates a reflected electron amount on the basis of a signal from the reflected-electron detector 12.

A stage driving control circuit 118 drives and controls the θ-Z stage 9, and drives and controls the X-Y stage 11 in cooperation with a laser interferometer LIM for detecting the position of the X-Y stage 11.

A sub-controller 120 reads out exposure control data from a memory 121 via an interface 122 to control the control circuits 111 to 116 and 118 based on the readout data, and controls the reflected-electron detection circuit 117. A main controller 123 integrally controls the whole electron beam exposure apparatus 100.

The schematic operation of the electron beam exposure apparatus 100 shown in FIG. 1 will be described with reference to FIG. 7.

The sub-controller 120 reads out exposure control data from the memory 121, extracts, from the exposure control data, deflection control data (main deflector reference position, sub-deflector reference position, main deflection stage following data, and deflection control data) as control data for controlling the deflector 6, and provides the extracted data to the deflection control circuit 115. In addition, the sub-controller 120 extracts, from the exposure control data, blanker control data as control data for controlling each blanker of the blanker array BA, and data for correcting control of the blanker, and provides the extracted data to the BA control circuit 111. The provided data are respectively stored in a basic dose data memory 901 and proximity correction coefficient memories (902 to 905) of the BA control circuit 111.

The deflection control circuit 115 controls the deflector 6 based on the deflection control data to deflect a plurality of electron beams. At the same time, the BA control circuit 111 controls each blanker of the blanker array BA to turn on/off the blanker in accordance with a pattern to be drawn on the substrate 5. In scanning the substrate 5 with a plurality of electron beams in order to draw a pattern on the substrate 5, the X-Y stage 11 is continuously driven in the Y direction, and a plurality of electron beams are deflected by the deflector 6 so as to follow movement of the X-Y stage 11.

Figure 8:
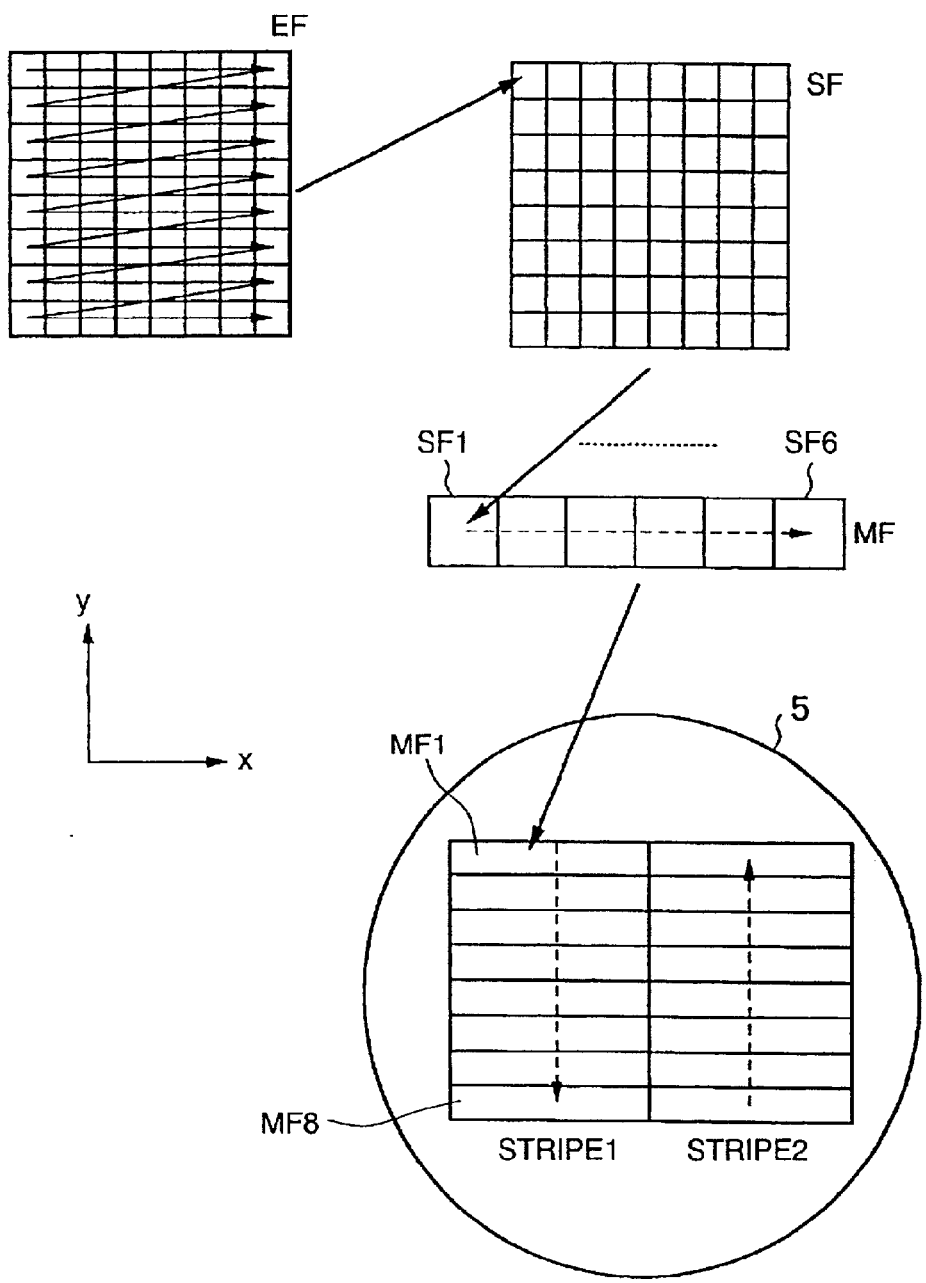
FIG. 8 is a view for explaining the exposure principle of the electron beam exposure apparatus shown in FIG. 1.

As shown in FIG. 8, each electron beam scans and exposes a corresponding element exposure field (EF) on the substrate 5. This electron beam exposure apparatus is designed such that element exposure fields (EF) for respective electron beams are two-dimensionally adjacent to each other, and a subfield (SF) formed from a plurality of element exposure fields (EF) is exposed at once. In the example shown in FIG. 8, one element exposure field (EF) has a matrix of 8×8 elements. Each element of this matrix represents a field (position) where the substrate 5 is irradiated with an electron beam deflected by the deflector 6. In other words, one element exposure field (EF) having a matrix of 8×8 elements is scanned with one electron beam in a direction indicated by an arrow in FIG. 8.

After one subfield (SF1) is exposed, the sub-controller 120 instructs the deflection control circuit 115 to deflect a plurality of electron beams by the deflector 6 in a direction (X direction) perpendicular to the scan direction (Y direction) of the X-Y stage 11 in scan/exposure so as to expose the next subfield (SF2).

Aberration upon reducing and projecting each electron beam via the reduction electron optical system 4 also changes with switching of the subfield. The sub-controller 120 instructs the LAU control circuit 112, D_STIG control circuit 113, and D_FOCUS control circuit 114 to adjust the lens array unit LAU, dynamic stigmatic coil 8, and dynamic focus coil 7 so as to correct the changed aberration.

After the subfield is switched, a plurality of electron beams execute exposure of corresponding element exposure fields (EF) again to expose the second subfield (SF2). As shown in FIG. 8, exposure of subfields SF1 to SF6 is sequentially executed to complete exposure of a main field (MF) formed from the subfields SF1 to SF6 aligned in the direction (X direction) perpendicular to the scan direction (Y direction) of the X-Y stage 11 in scan/exposure.

After exposure of the first main field (MF1) shown in FIG. 8 is completed in this manner, the sub-controller 120 instructs the deflection control circuit 115 to sequentially deflect a plurality of electron beams to main fields (MF2, MF3, MF4, . . . ) aligned in the scan direction (Y direction) of the X-Y stage 11 and execute exposure. As a result, as shown in FIG. 8, exposure of a stripe field (STRIPE1) formed from the main fields (MF1, MF2, MF3, MF4, . . . ) is executed.

The sub-controller 120 instructs the stage driving control circuit 118 to move the X-Y stage 11 by one step in the X direction, and executes exposure of the next stripe field (STRIPE2).

Figure 9:
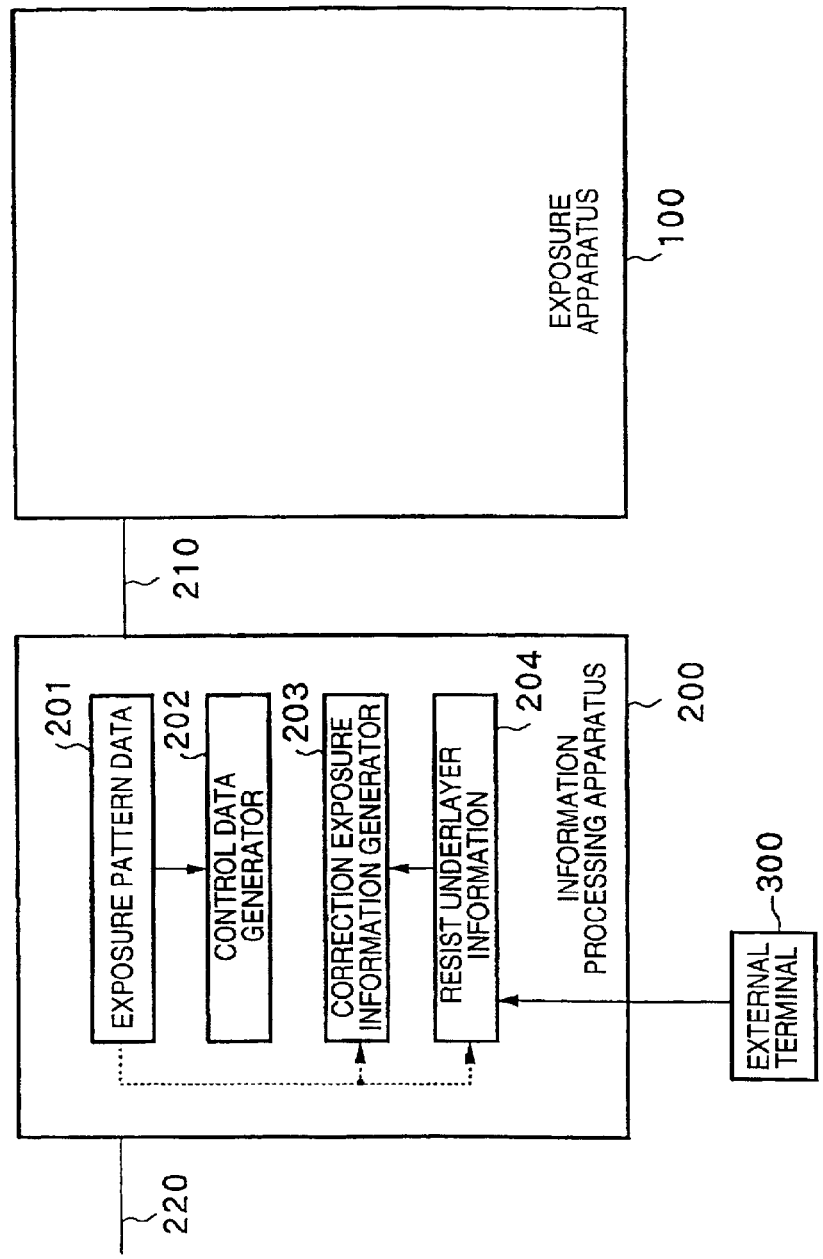
FIG. 9 is a block diagram showing the configuration of a system including the exposure apparatus.

FIG. 9 is a block diagram showing the configuration of a system including the exposure apparatus. This system is constituted by connecting the electron beam exposure apparatus 100 shown in FIG. 1 and an information processing apparatus 200 via a communication cable 210. The information processing apparatus 200 acquires, e.g., exposure pattern data from another information processing apparatus via a communication cable 220, generates compressed exposure control data suited for the electron beam exposure apparatus 100 on the basis of the exposure pattern data, and provides the generated data to the electron beam exposure apparatus 100 via the communication cable 210.

More specifically, the information processing apparatus 200 acquires exposure pattern data from another information processing apparatus via the communication cable 220, and stores the exposure pattern data in a storage 201. The exposure pattern data may be acquired from a memory medium (e.g., a magnetic tape or disk) which stores the data.

The information processing apparatus 200 generates in a control data generator 202 a plurality of control data (containing, e.g., dot control data or dose control data for controlling the blanker, and deflection control data for controlling the deflector) for controlling the electron beam exposure apparatus 100 on the basis of the exposure pattern data. The generated control data contain reference dose data as basic exposure information.

The reference dose data is information serving as the base of drawing information depending on a pattern to be exposed. The opening/closing state of the blanker is controlled based on this information. More specifically, the reference dose data includes data (duty) for defining the structure of bitmap data ("0" or "1"), or the bitmap structure and a blanker opening/closing time (irradiation time ratio).

Irradiation light emitted by the electron gun 1 has a predetermined irradiation intensity depending on the light source, and irradiation energy can be desirably controlled by the duty of the blanker. The following "proximity effect correction" realizes an irradiation (exposure) state most suited for a member to be exposed by performing correction of increasing/decreasing the duty defined by reference dose data regardless of a drawing pattern in consideration of various conditions of the member to be exposed.

A correction exposure information generator 203 in the information processing apparatus 200 generates correction exposure information for performing proximity effect correction for each irradiation position with respect to the reference dose data generated by the control data generator 202. The correction exposure information is correction data independent of an exposure pattern, and is generated in consideration of the backward scattering radius, resist material, difference in underlayer conditions, and the like as parameters used when a surface is exposed with a pattern. The resist information, underlayer information, and the like may refer to resist & underlayer information 204 which is input from an external terminal 300 and stored in the information processing apparatus 200, or may refer to information concerning an exposure pattern. The duty of the irradiation time is corrected for the reference dose data having undergone proximity effect correction.

Figure 10:
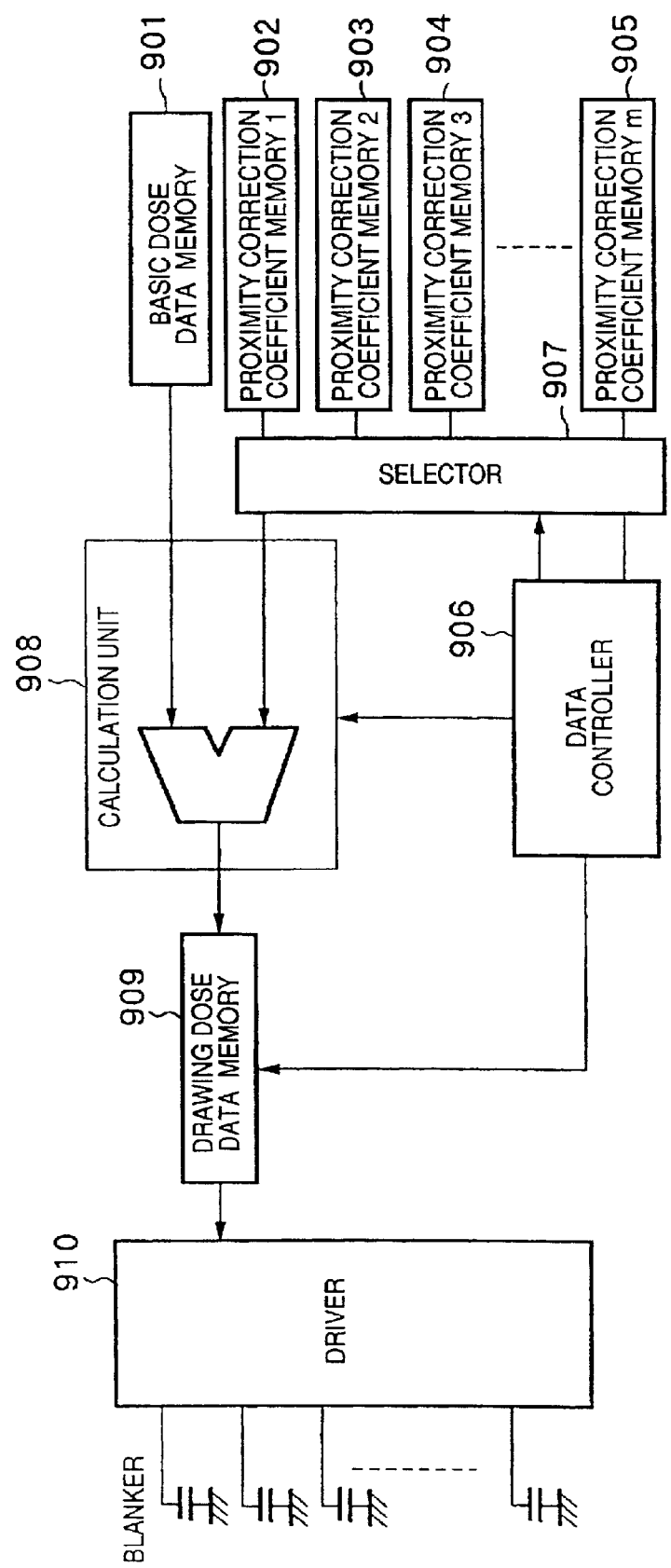
FIG. 10 is a block diagram for explaining the arrangement of a BA control circuit.

FIG. 10 is a block diagram showing an arrangement of the BA control circuit (Blanker Array control circuit) 111 described with reference to FIG. 7. The blanker array control circuit 111 comprises the basic dose data memory 901 for storing reference dose data serving as basic exposure information, proximity correction coefficient memory 1 (902), proximity correction coefficient memory 2 (903), ..., proximity correction coefficient memory m (905) for storing pieces of correction exposure information containing proximity effect correction coefficients, a data controller 906 for executing data control for performing proximity effect correction for reference dose data serving as a base in order to realize appropriate exposure for a member to be exposed, a selector 907 for selecting one of pieces of correction exposure information from the proximity correction coefficient memories (902 to 905) in order to correct reference dose data, a calculation unit 908 for calculating dose data having undergone proximity effect correction for drawing a pattern on a member to be exposed on the basis of the selected correction exposure information and reference dose data stored in the basic dose data memory 901, a drawing dose data memory 909 for temporarily storing an output of the calculation result, and a driver 910 for driving the blanker on the basis of the corrected dose data.

The data controller 906 controls the calculation unit 908 based on a selection result from the selector 907, and executes data control for changing the duty of reference dose data.

Figure 11:
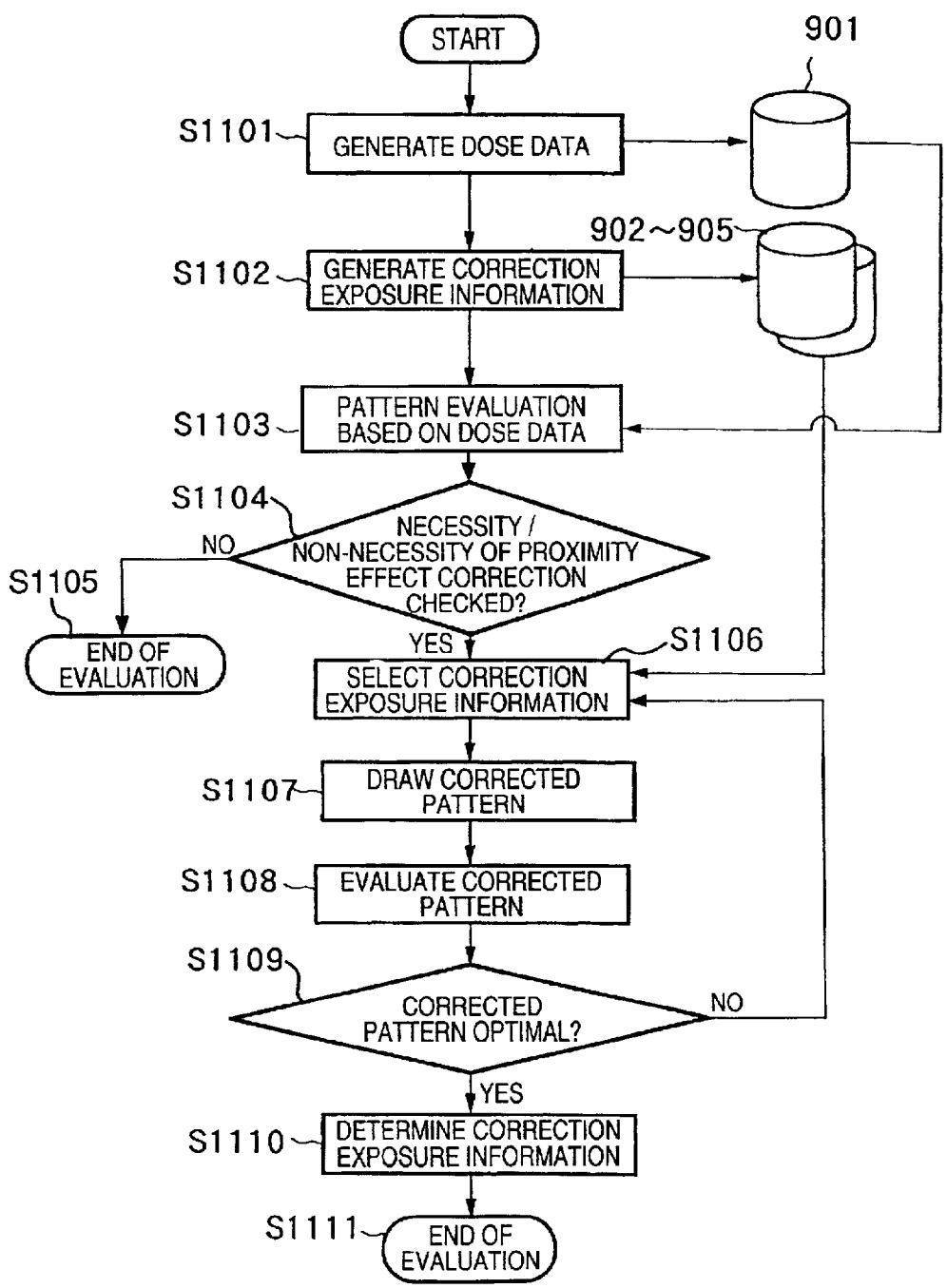
FIG. 11 is a flow chart for explaining the flow of evaluation processing for determining exposure correction processing.

FIG. 11 is a flow chart for explaining an evaluation flow concerning generation of data, and selection and determination of correction exposure information. In step S1101, reference dose data as basic exposure information is generated by the control data generator 202 of the information processing apparatus 200, and stored in the basic dose memory 901 of the BA control circuit 111.

In step S1102, pieces of correction exposure information containing proximity effect correction coefficients are generated by the correction exposure information generator 203 of the information processing apparatus 200, and stored in the proximity correction coefficient memories 902 to 905.

In step S1103, a pattern is drawn based on the reference dose data generated in step S1101.

In step S1104, whether proximity effect correction is necessary is checked from the drawn pattern. If NO in step S1104, evaluation ends (S1105). If YES in step S1104, the processing shifts to step S1106 to select one of the pieces of correction exposure information stored in the proximity correction coefficient memories (902 to 905) (S1106). Then, a pattern is drawn based on dose data containing the selected correction exposure information (this will be called a "corrected pattern") (S1107).

The corrected pattern is evaluated in step S1108, and whether the correction exposure information selected in step S1106 is proper and whether the corrected pattern is optimal are checked in step S1109. If the selected correction exposure information is determined not to be proper, the processing returns to step S1106 to select another correction exposure information and repeat the same processes (S1107 and S1108).

If the corrected pattern is determined to be optimal in step S1109, the processing advances to step S1110 to determine the correction exposure information (S1110) and end evaluation (S1111).

During the processing of FIG. 11, processes concerning necessity/non-necessity of correction, selection of correction exposure information (steps S1104 and S1106), evaluation of a corrected pattern, and determination of optimum (steps S1108 and S1109) are desirably checked visually and selected by the operator. Alternatively, these processes can be done by an evaluation apparatus for executing processes corresponding to the respective steps (steps S1104, S1106, S1108, and S1109).

FIG. 12 is a table showing the relationship between the drawing position (Xn,Yn) and correction exposure information B(n,m). The drawing position is coordinate components of a matrix forming an element exposure field (EF) shown in FIG. 8, and is a unit irradiated with a charged particle beam. Reference numeral 1201 denotes a drawing position by drawing position coordinates expressed as a column matrix; and 1202 and 1203, pieces of correction exposure information generated under different conditions which are in one-to-one correspondence with the respective components of the drawing position. Correction exposure information 1 (1202) and correction exposure information m (1203) are respectively stored in proximity correction coefficient memory 1 (902) and proximity correction coefficient memory m (905) in FIG. 10, and one of them is selected by the selector 907. Set correction exposure information is not common to all the element exposure fields (EF), and correction exposure information is individually selected and set.

Note that correction exposure information contains data determined by the sequence of FIG. 11.

Figure 13:
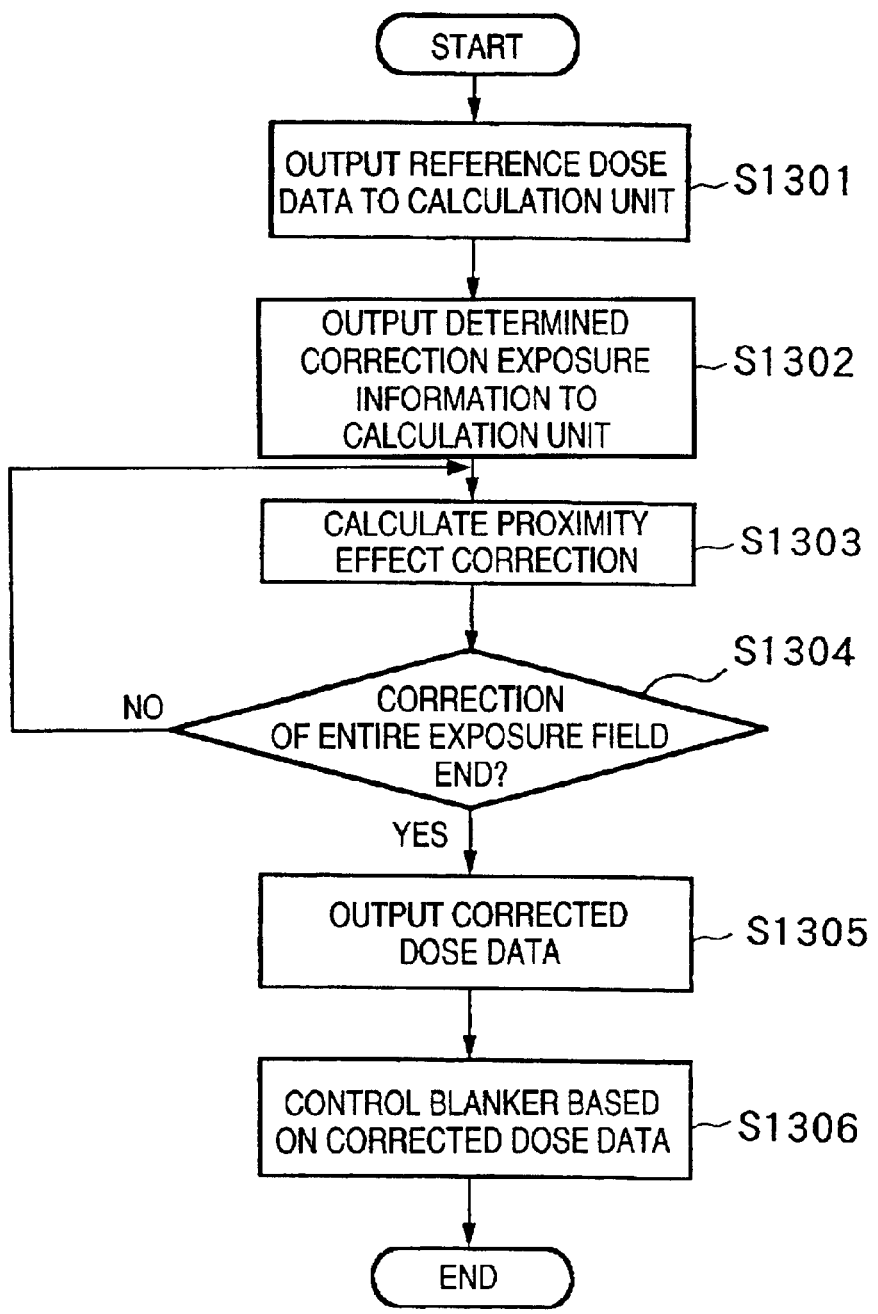
FIG. 13 is a flow chart for explaining the processes of a data controller and calculation unit.

FIG. 13 is a flow chart for explaining the processes of the data controller 906 and calculation unit 908 (FIG. 10). Drawing of a corrected pattern having undergone proximity effect correction for each irradiation position will be explained in accordance with the flow chart.

The data controller 906 outputs to the calculation unit 908 reference dose data which has already been generated and stored in the basic dose data memory 901 (S1301). The data controller 906 outputs to the calculation unit 908 correction exposure information determined in accordance with the evaluation sequence of FIG. 11 (S1302).

The calculation unit 908 performs proximity effect correction for the reference dose data in accordance with the determined correction exposure information (S1303). This correction is to change the duty for controlling the opening/closing state of the blanker. For example, when the duty of the reference dose data is "1.0", correction of increasing the duty by 20% results in corrected dose data of "1.2", or correction of decreasing the duty by 20% results in corrected dose data of "0.8".

In step S1304, the calculation unit 908 checks whether proximity effect correction is completed for the entire exposure field. If NO in step S1304, processing in step S1303 is continued; or if YES, the calculation unit 908 outputs the corrected dose data to the drawing dose data memory 909 (S1305). Note that the drawing dose data memory 909 functions as a kind of buffer, and is not essential to the arrangement of the embodiment according to the present invention. Hence, the calculation unit 908 may output the corrected dose data to the driver 910. The driver 910 controls the opening/closing state of the blanker in accordance with the corrected dose data (S1306).

As described above, this embodiment can realize exposure having rapidly undergone proximity effect correction by selecting and determining appropriate correction exposure information.

[Device Manufacturing Method]

An embodiment of a device manufacturing method using the electron beam exposure apparatus 100 according to the above embodiment will be described.

FIG. 14 is a flow chart showing the manufacturing flow of a microdevice (semiconductor chip such as an IC or LSI, liquid crystal panel, CCD, thin-film magnetic head, micromachine, or the like). In step 1 (circuit design), a semiconductor device circuit is designed. In step 2 (creation of exposure control data), the information processing apparatus 200 creates exposure control data of the exposure apparatus based on the designed circuit pattern. In step 3 (wafer manufacture), a wafer is manufactured using a material such as silicon. In step 4 (wafer process) called a pre-process, an actual circuit is formed on the wafer by lithography using the electron beam exposure apparatus 100 which has received the exposure control data created in step 2. Step 5 (assembly) called a post-process is the step of forming a semiconductor chip using the wafer manufactured in step 4, and includes an assembly process (dicing and bonding), packaging process (chip encapsulation), and the like. In step 6 (inspection), inspections such as the operation confirmation test and durability test of the semiconductor device manufactured in step 5 are conducted. After these steps, the semiconductor device is completed and shipped (step 7).

FIG. 15 is a flow chart showing the detailed flow of the wafer process shown in FIG. 14. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the electron beam exposure apparatus 100 exposes the wafer to a circuit pattern. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

The present invention can realize exposure having rapidly undergone proximity effect correction by selecting appropriate correction exposure information.

As many apparently widely different embodiments of the present invention can be made without departing from the spirit and scope thereof, it is to be understood that the invention is not limited to the specific embodiments thereof except as defined in the appended claims.

What is claimed is:

1. A charged-particle beam exposure apparatus for exposing a member to be exposed to a charged particle beam with a pattern, comprising:

storage means for storing a plurality of data for controlling a dosage of the charged particle beam in accordance with an irradiation position of the charged particle beam on the member to be exposed, wherein the data depends on a parameter representing at least one of an underlayer condition of the member to be exposed, a resist material, a forward scattering radius, and a backward scattering radius, wherein the plurality of data are generated based on each different value of the parameter;

selection means for selecting any one of the plurality of data stored in said storage means; and exposure means for controlling the dosage of the charged particle beam on the basis of the data selected by said selection means, thereby exposing the member to be exposed with the pattern.

2. The apparatus according to claim 1, wherein the data includes correction data for correcting influence of a proximity effect on reference dose data.

3. A charged-particle beam exposure apparatus for exposing a member to be exposed to a charged particle beam with a pattern, comprising:

first storage means for storing reference dose data of the charged particle beam in accordance with an irradiation position of the charged particle beam on the member to be exposed;

second storage means for storing a plurality of control data for performing proximity effect correction in accordance with the irradiation position with respect to the reference dose data, wherein the control data depends on a parameter of a proximity effect correction calculation, the plurality of control data are generated based on each different parameter;

selection means for selecting one of the plurality of control data stored in said second storage means; and exposure means for performing proximity effect correction for the reference dose data on the basis of the control data selected by said selection means, thereby exposing the member to be exposed with the pattern.

4. The apparatus according to claim 3, wherein the reference dose data includes data for defining bitmap data determined depending on a pattern to be exposed, or data for defining bitmap data and an irradiation time ratio.

5. The apparatus according to claim 3, wherein the parameter includes at least one of an underlayer condition of the member to be exposed, a resist material, a forward scattering radius, and a backward scattering radius.

6. A control data determination method comprising:

a step of generating reference dose data in accordance with an irradiation position of a charged particle beam for exposing a member to be exposed with a reference pattern;

a generation step of generating a plurality of control data to the reference dose data, based on each different parameter of a proximity effect correction calculation;

a storage step of storing in a memory the plurality of generated control data;

a selection step of selecting any one of the plurality of control data that are stored in the memory;

an exposure step of performing proximity effect correction for the reference dose data on the basis of the selected control data, thereby exposing the member to be exposed with a pattern;

a determination step of evaluating the exposed pattern to determine whether the selected control data is proper data for controlling the reference dose data; and a control data determination step of determining proper control data for controlling the reference dose data in accordance with a determination result.

7. The method according to claim 6, wherein whether the selected control data is proper data for controlling the reference dose data is determined by comparing the exposed pattern with the reference pattern by a visual check.

8. The method according to claim 6, wherein whether the selected control data is proper data for controlling the reference dose data is determined by evaluation means for comparing the exposed pattern with the reference pattern.

9. The method according to claim 6, wherein the reference dose data includes data for defining bitmap data determined depending on a pattern to be exposed, or data for defining bitmap data and an irradiation time ratio.

10. The method according to claim 6, wherein the parameter includes at least one of an underlayer condition of the member to be exposed, a resist material, a forward scattering radius, and a backward scattering radius.

11. The method according to claim 6, wherein the selection step performs a processing for selecting control data other than the selected control data until proper control data is determined based on the determination result.

12. A charged-particle beam exposure method of exposing a member to be exposed to a charged particle beam with a pattern, comprising:

a step of generating a plurality of data for controlling a dosage of the charged particle beam in accordance with an irradiation position of the charged particle beam on the member to be exposed, and storing the data in a memory, wherein the data depends on a parameter representing at least one of an underlayer condition of the member to be exposed, a resist material, a forward scattering radius, and a backward scattering radius, wherein the plurality of data are generated based on each different value of the parameter;

a selection step of selecting any one of the plurality of data stored in the memory; and an exposure step of controlling the dosage of the charged particle beam on the basis of the data selected in the selection step, thereby exposing the member to be exposed with the pattern.

13. The method according to claim 12, wherein the data includes correction data for correcting influence of a proximity effect on reference dose data.

14. A charged-particle beam exposure method of exposing a member to be exposed to a charged particle beam with a pattern, comprising:

a step of generating reference dose data of the charged particle beam in accordance with an irradiation position of the charged particle beam on the member to be exposed, and storing the reference dose data in a first memory;

a step of generating a plurality of control data to the reference dose data, based on each different parameter of a proximity effect correction calculation, and storing the generated plurality of control data in a second memory;

a selection step of selecting one of the plurality of control data stored in the second memory; and an exposure step of performing proximity effect correction for the reference dose data on the basis of the control data selected in the selection step, thereby exposing the member to be exposed with the pattern.

15. The method according to claim 14, wherein the reference dose data includes data for defining bitmap data determined depending on a pattern to be exposed, or data for defining bitmap data and an irradiation time ratio.

16. The method according to claim 14, wherein the parameter includes at least one of an underlayer condition of the member to be exposed, a resist material, a forward scattering radius, and a backward scattering radius.

17. A device manufacturing method which uses for part of a manufacturing process a charged-particle beam exposure apparatus for performing proximity effect correction for a charged particle beam to expose a member to be exposed with a pattern, wherein the charged-particle beam exposure apparatus executes:

a step of generating a plurality of control data for controlling reference dose data of the charged particle beam in accordance with an irradiation position of the charged particle beam on the member to be exposed, and storing the control data in a memory, wherein the control data depends on a parameter representing at least one of an underlayer condition of the member to be exposed, a resist material, a forward scattering radius, and a backward scattering radius, wherein the plurality of control data are generated based on each different value of the parameter;

a selection step of selecting any one of the plurality of control data stored in the memory; and an exposure step of controlling the reference dose data of the charged particle beam on the basis of the control data selected in the selection step, thereby exposing the member to be exposed with the pattern.

18. A device manufacturing method which uses for part of a manufacturing process a charged-particle beam exposure apparatus for performing proximity effect correction for a charged particle beam to expose a member to be exposed with a pattern, wherein the charged-particle beam exposure apparatus executes:

a step of generating reference dose data of the charged particle beam in accordance with an irradiation position of the charged particle beam on the member to be exposed, and storing the reference dose data in a first memory;

a step of generating a plurality of control data to the reference dose data, based on each different parameter of a proximity effect correction calculation, and storing the generated plurality of control data in a second memory;

a selection step of selecting one of the plurality of control data stored in the second memory; and an exposure step of performing proximity effect correction for the reference dose data on the basis of the control data selected in the selection step, thereby exposing the member to be exposed with the pattern.

19. An apparatus for irradiating a plurality of charged-particle beams to a sample, and forming a pattern on the sample, said apparatus comprising:

a memory for storing data for performing proximity effect correction; and a first device for controlling individually irradiation to the sample of each of the charged-particle beams based on the data stored in said memory, wherein the data depends on a parameter representing at least one of an underlayer condition of the sample to be exposed, a resist material, a forward scattering radius and a backward scattering radius, and wherein the data is generated based on each different value of the parameter.

20. A device manufacturing method comprising:

a step of forming a pattern on a sample with an apparatus for irradiating a plurality of charged-particle beams to the sample, and forming the pattern on the sample; and a step of developing the sample on which the pattern is formed, wherein the apparatus comprises a memory for storing data for performing proximity effect correction, and a first device for controlling individually irradiation to the sample of each of the charged-particle beams based on the data stored in the memory, wherein the data depends on a parameter representing at least one of an underlayer condition of the sample to be exposed, a resist material, a forward scattering radius and a backward scattering radius, and wherein the data is generated based on each different value of the parameter.

21. An apparatus for irradiating a plurality of charged-particle beams to a sample, and forming a pattern on the sample, said apparatus comprising:

a memory for storing data for performing proximity effect correction; and a first device for controlling individually irradiation to the sample of each of the charged-particle beams based on the data stored in said memory, wherein the data depends on a parameter of a proximity effect correction calculation, and the data is generated based on each different parameter.

22. A device manufacturing method comprising:

a step of forming a pattern on a sample with an apparatus for irradiating a plurality of charged-particle beams to the sample, and forming the pattern on the sample; and a step of developing the sample on which the pattern is formed, wherein the apparatus comprises a memory for storing data for performing proximity effect correction, and a first device for controlling individually irradiation to the sample of each of the charged-particle beams based on the data stored in the memory, and wherein the data depends on a parameter of a proximity effect correction calculation, and the data is generated based on each different parameter.

23. An apparatus for irradiating a plurality of charged-particle beams to a sample, and forming a pattern on the sample, said apparatus comprising:

a memory for storing data for performing proximity effect correction; and a blanker array having a plurality of apertures two-dimensionally arrayed on a same plane located almost perpendicularly to a pass through direction of the plurality of charged-particle beams and a plurality of pairs of electrodes provided on both sides of each aperture, wherein the plurality of pairs of electrodes individually deflect the plurality of charged-particle beams, and individually control irradiating of the plurality of charged-particle beams to the sample.

24. A device manufacturing method comprising:

a step of forming a pattern on a sample with an apparatus for irradiating a plurality of charged-particle beams to the sample, and forming the pattern on the sample; and a step of developing the sample on which the pattern is formed, wherein the apparatus comprises a memory for storing data for performing proximity effect correction, and a blanker array having a plurality of apertures two-dimensionally arrayed on a same plane located almost perpendicularly to a pass through direction of the plurality of charged-particle beams and a plurality of pairs of electrodes provided on both sides of each aperture, wherein the plurality of pairs of electrodes individually deflect the plurality of charged-particle beams, and individually control irradiating of the plurality of charged-particle beams to the sample.

25. An apparatus for irradiating a plurality of charged-particle beams to a sample, and forming a pattern on the sample, said apparatus comprising:

a memory for storing data for performing proximity effect correction; and a blanker array having a plurality of apertures two-dimensionally arrayed on a same plane located almost perpendicularly to a pass through direction of the plurality of charged-particle beams and a plurality of pairs of electrodes, wherein electrodes from respective ones of the pairs of electrodes are provided on opposite sides of respective ones of the apertures, wherein the plurality of pairs of electrodes individually deflect the plurality of charged-particle beams based on the data stored in said memory, and individually control irradiating of the plurality of charged-particle beams to the sample.

26. A device manufacturing method comprising:

a step of forming a pattern on a sample with an apparatus for irradiating a plurality of charged-particle beams to the sample, and forming the pattern on the sample; and a step of developing the sample on which the pattern is formed, wherein the apparatus comprises a memory for storing data for performing proximity effect correction, and a blanker array having a plurality of apertures two-dimensionally arrayed on a same plane located almost perpendicularly to a pass through direction of the plurality of charged-particle beams and a plurality of pairs of electrodes, wherein electrodes from respective ones of the pairs of electrodes are provided on opposite sides of respective ones of the apertures, wherein the plurality of pairs of electrodes individually deflect the plurality of charged-particle beams based on the data stored in the memory, and individually control irradiating of the plurality of charged-particle beams to the sample.

* * * * *